United States Patent
Laine

(10) Patent No.: US 8,694,521 B2
(45) Date of Patent: Apr. 8, 2014

(54) MODELING AND SEARCHING PATTERNS IN A DATA SEQUENCE

(76) Inventor: Unto Laine, Vantaa (FI)

(*) Notice: Subject to any disclaimer, the term of this patent is extended or adjusted under 35 U.S.C. 154(b) by 0 days.

(21) Appl. No.: 13/380,760

(22) PCT Filed: Jun. 23, 2010

(86) PCT No.: PCT/EP2010/058904
§ 371 (c)(1),
(2), (4) Date: Jan. 23, 2012

(87) PCT Pub. No.: WO2010/149698
PCT Pub. Date: Dec. 29, 2010

(65) Prior Publication Data
US 2012/0131029 A1    May 24, 2012

(30) Foreign Application Priority Data
Jun. 24, 2009  (FI) .................................... 20095708

(51) Int. Cl.
G06F 7/00 (2006.01)

(52) U.S. Cl.
USPC ........................................................ 707/758

(58) Field of Classification Search
USPC ........................................................ 707/758
See application file for complete search history.

(56) References Cited

U.S. PATENT DOCUMENTS 5,561,421 A * 10/1996 Smith et al. ............... 341/51
5,742,811 A *  4/1998 Agrawal et al. ............. 1/1
7,365,658 B2 * 4/2008 Todorov et al. ............ 341/63

OTHER PUBLICATIONS

Ziv et al., "A Universal Algorithm for Sequential Data Compression", IEEE Transactions on Information Theory, vol. IT-23, No. 3, May 1977.*
C.C. Wong et al., "Improvements on a semi-automatic grammar induction framework", Automatic Speech Recognition and Understanding, 2001. ASRU '01, IEEE Workshop, Dec. 9, 2001 pp. 288-291.
H.M. Meng et al., "Semiautomatic acquisition of semantic structures for understanding domain-specific natural language queries" IEEE Transactions on Knowledge and Data Engineering, vol. 14, No. 1, Jan. 1, 2002, pp. 172-181.
K.Y. Su et al., "Corpus-based Automatic Compound Extraction with Mutual Information and Relative Frequency Count", Proceedings of Rocling VI Computational Linquistics Conference VI, [Online] 1993, pp. 207-216.
G. Bouma, "Normalized (pointwise) mutual information in collocation extraction" Proceedings of GSCL, [Online] Sep. 2009, 11 pages.
W. Geamsakul et al., "Performance evaluation of decision tree graph-based induction" Discovery Science, 2003, pp. 128-140.

(Continued)

Primary Examiner — James Trujillo
Assistant Examiner — Mohsen Almani
(74) Attorney, Agent, or Firm — Muncy, Geissler, Olds & Lowe, P.C.

(57) ABSTRACT

The invention allows modeling and searching patterns in a data sequence. A data sequence is analyzed to determine at least two data elements that, when replaced with one replacement data element, will cause a metric of irregularity of the data sequence being analyzed to be maximized. The replacement data element is not included in the data sequence being analyzed. The determined at least two data elements are replaced with the replacement data element thereby generating a residual data sequence. The steps of analyzing and replacing are iterated until reaching a predetermined value of an iteration threshold, wherein with each iteration the analyzing and replacing are applied to the residual data sequence generated in the preceding iteration.

15 Claims, 4 Drawing Sheets

(56) References Cited

OTHER PUBLICATIONS

M. Takashi et al., "Extension of Graph-Based Induction for General Graph Structured Date", Knowledge Discovery and Data Mining. Current Issues and New Applications, Apr. 18, 2000 pp. 420-431.
H. Motoda et al., "Machine Learning Techniques to Make Computers Easier to Use", Artificial Intelligence, vol. 103, 1998, pp. 295-321.
T. M. Cover et al., "Elements of Information Theory", Wiley Interscience, Jan. 1, 2006, cover pages and pp. 13-55.
E. T. Jaynes, "On the Rationale of Maximum-Entropy Methods", Proceedings of the IEEE, vol. 70, No. 9, Sep. 1, 1982, pp. 939-952.
G. Yeo et al., "Maximum entropy modeling of short sequence motifs with applications to RNA splicing signals" Journal of Computational Biology, vol. 11, No. 2-3, 2004, pp. 377-394.
R. Rosenfeld, "A Maximum Entropy Approach to Adaptive Statistical Language Modelling", Computer Speech and Language, vol. 10, No. 3, Jul. 1, 1996, pp. 187-228.

\* cited by examiner

MODELING AND SEARCHING PATTERNS IN A DATA SEQUENCE

BACKGROUND OF THE INVENTION

1. Field of the Invention

The invention relates generally to modeling and searching data patterns. In particular, the invention relates to methods, computer programs and apparatuses for modeling and searching patterns in a data sequence.

2. Description of the Related Art

Today, various kinds of procedures are used to detect patterns or structures in data. When found, such patterns can be utilized in many ways.

For example, the art of pattern recognition endeavors to classify patterns based either on prior knowledge or on statistical information extracted from the patterns. The patterns to be classified are usually groups of measurements or observations.

Cluster analysis refers to the assignment of a set of observations into subsets called clusters so that observations in the same cluster are similar in some sense. Clustering is a method of unsupervised learning, and a common technique for statistical data analysis used in many fields, including machine learning, data mining, pattern recognition, image analysis and bioinformatics.

Data mining refers to the process of extracting hidden patterns from data. It is commonly used in a range of profiling practices, such as marketing, surveillance, fraud detection and scientific discovery.

However, there tends to be various problems associated with the different pattern detection, recognition and analysis procedures of the prior art. For example, prior art procedures often require some sort of prior information or knowledge about the patterns in order to be effective, particularly when lossless compression is required.

Therefore, an object of the present invention is to alleviate the problems described above and to introduce a solution that allows searching patterns in a data sequence effectively and even without any prior knowledge.

SUMMARY OF THE INVENTION

A first aspect of the present invention is a method of searching patterns in a data sequence. A data sequence comprising a set of data elements is analyzed to determine at least two data elements of the set of data elements that, when replaced with one replacement data element, will cause a predetermined metric of irregularity of the data sequence being analyzed to be maximized. The replacement data element is a data element that is not included in the set of data elements of the data sequence being analyzed, and the data sequence being analyzed is comprised in one or more computer readable files. The determined at least two data elements are replaced with the replacement data element thereby generating a residual data sequence. The steps of analyzing and replacing are iterated until reaching a predetermined value of an iteration threshold, wherein with each iteration the steps of analyzing and replacing are applied to the residual data sequence generated in the preceding iteration.

A second aspect of the present invention is an apparatus for searching patterns in a data sequence. The apparatus comprises an analyzer that is configured to analyze a data sequence comprising a set of data elements to determine at least two data elements of the set of data elements that, when replaced with one replacement data element, will cause a predetermined metric of irregularity of the data sequence being analyzed to be maximized, wherein the replacement data element is not included in the set of data elements of the data sequence being analyzed and the data sequence being analyzed is comprised in one or more computer readable files. The apparatus further comprises a generator configured to replace the determined at least two data elements with the replacement data element thereby generating a residual data sequence. The apparatus further comprises a controller configured to direct the analyzer and the generator to iterate the analyzing and replacing until reaching a predetermined value of an iteration threshold, wherein with each iteration the analyzing and replacing are applied to the residual data sequence generated in the preceding iteration.

A third aspect of the present invention is a computer program embodied on a computer readable medium for searching patterns in a data sequence. The computer program controls a data-processing device to perform the steps of:

analyzing a data sequence comprising a set of data elements to determine at least two data elements of the set of data elements that, when replaced with one replacement data element, will cause a predetermined metric of irregularity of the data sequence being analyzed to be maximized, the replacement data element not included in the set of data elements of the data sequence being analyzed, wherein said data sequence being analyzed is comprised in one or more computer readable files;

replacing the determined at least two data elements with the replacement data element thereby generating a residual data sequence; and iterating the steps of analyzing and replacing until reaching a predetermined value of an iteration threshold, wherein with each iteration the steps of analyzing and replacing are applied to the residual data sequence generated in the preceding iteration.

A fourth aspect of the present invention is an apparatus for searching patterns in a data sequence. The apparatus comprises an analyzing means for analyzing a data sequence comprising a set of data elements to determine at least two data elements of the set of data elements that, when replaced with one replacement data element, will cause a predetermined metric of irregularity of the data sequence being analyzed to be maximized, wherein the replacement data element is not included in the set of data elements of the data sequence being analyzed and the data sequence being analyzed is comprised in one or more computer readable files. The apparatus further comprises a generating means for replacing the determined at least two data elements with the replacement data element thereby generating a residual data sequence. The apparatus further comprises a controlling means for directing the analyzer and the generator to iterate the steps of analyzing and replacing until reaching a predetermined value of an iteration threshold, wherein with each iteration the steps of analyzing and replacing are applied to the residual data sequence generated in the preceding iteration.

A fifth aspect of the present invention is a computer readable storage medium encoded with instructions that, when executed by a computer, perform a process of searching patterns in a data sequence. The process comprises:

analyzing a data sequence comprising a set of data elements to determine at least two data elements of the set of data elements that, when replaced with one replacement data element, will cause a predetermined metric of irregularity of the data sequence being analyzed to be maximized, the replacement data element not included in the set of data elements of the data sequence being analyzed, wherein said data sequence being analyzed is comprised in one or more computer readable files;

replacing the determined at least two data elements with the replacement data element thereby generating a residual data sequence; and iterating the steps of analyzing and replacing until reaching a predetermined value of an iteration threshold, wherein with each iteration the steps of analyzing and replacing are applied to the residual data sequence generated in the preceding iteration.

A sixth aspect of the present invention is an apparatus for searching patterns in a data sequence. The apparatus comprises at least one processor and at least one memory including computer program code. The at least one memory and the computer program code are configured to, with the at least one processor, cause the apparatus to at least to perform:

analyzing a data sequence comprising a set of data elements to determine at least two data elements of the set of data elements that, when replaced with one replacement data element, will cause a predetermined metric of irregularity of the data sequence being analyzed to be maximized, the replacement data element not included in the set of data elements of the data sequence being analyzed, wherein said data sequence being analyzed is comprised in one or more computer readable files;

replacing the determined at least two data elements with the replacement data element thereby generating a residual data sequence; and iterating the steps of analyzing and replacing until reaching a predetermined value of an iteration threshold, wherein with each iteration the steps of analyzing and replacing are applied to the residual data sequence generated in the preceding iteration.

In an embodiment of the invention, the metric of irregularity comprises a degree of interdependency between the data elements of the set of data elements of the data sequence being analyzed such that the at least two data elements to be replaced are the data elements having the largest degree of interdependency between them.

In an embodiment of the invention, the degree of interdependency between the at least two data elements comprises:

$$F_{Pr1}(AB) = \frac{N(AB)N(AB)NN}{N_P N_P N(A)N(B)}$$

$$= \left(\frac{N}{N_P}\right)^2 \frac{N(AB)^2}{N(A)N(B)}$$

$$= \alpha^2 \frac{N(AB)^2}{N(A)N(B)};$$

wherein N denotes a length of the data sequence being analyzed, N(A) denotes a total number of data elements A in the data sequence being analyzed, N(B) denotes a total number of data elements B in the data sequence being analyzed, N(AB) denotes a number of occurrences of a data element pair AB in the data sequence being analyzed, $N_p$ denotes a number of occurrences of all the various data element pairs in the data sequence being analyzed, and $\alpha$ is a constant of a predetermined value.

In an embodiment of the invention, the degree of interdependency between the at least two data elements comprises:

$$F_{Pr2}(AB) = \beta \frac{(P(AB) - P(A)P(B))^2}{P(A)P(B)}$$

$$\approx \beta \frac{N^2 \left(\frac{N(AB)}{N_P} - \frac{N(A)N(B)}{N^2}\right)^2}{N(A)N(B)}$$

$$= \beta \frac{\left(\frac{NN(AB)}{N_P} - \frac{N(A)N(B)}{N}\right)^2}{N(A)N(B)};$$

$$\beta = \begin{cases} +1 & \text{when } P(AB) > P(A)P(B) \\ -1 & \text{when } P(AB) < P(A)P(B) \end{cases};$$

wherein N denotes a length of the data sequence being analyzed, N(A) denotes a total number of data elements A in the data sequence being analyzed, N(B) denotes a total number of data elements B in the data sequence being analyzed, N(AB) denotes a number of occurrences of a data element pair AB in the data sequence being analyzed, $N_P$ denotes a number of occurrences of all the various data element pairs in the data sequence being analyzed, P(A) denotes a probability of the data element A in the data sequence being analyzed, P(B) denotes a probability of the data element B in the data sequence being analyzed, and P(AB) denotes a probability of the data element pair AB in the data sequence being analyzed.

In an embodiment of the invention, the degree of interdependency between the at least two data elements comprises:

$$KLD(AB) = [1 - P(A) - P(B)]\log_2 \frac{N - N(AB)}{N} + \sum_{x=A,B} P(x)\log_2 P(x) \frac{N - N(AB)}{N(x) - N(AB)};$$

wherein P(A) denotes a probability of a data element A in the data sequence being analyzed, P(B) denotes a probability of a data element B in the data sequence being analyzed, N(AB) denotes the total number of data element pairs AB, and N denotes a length of the data sequence being analyzed.

In an embodiment of the invention, the metric of irregularity comprises an entropy of the data sequence being analyzed such that the at least two data elements to be replaced are the data elements the replacement of which will cause the largest entropy increase in the data sequence being analyzed.

In an embodiment of the invention, the entropy of the data sequence being analyzed comprises:

$$InfEnt(D) = -\sum_{k=1}^{K} p_k \log_2 p_k;$$

wherein D denotes the data sequence being analyzed, InfEnt denotes an information entropy, $p_k$ denotes a probability of a data element k, and K denotes a size of an alphabet of the data sequence being analyzed.

In an embodiment of the invention, the entropy of the data sequence being analyzed comprises:

$$ASE(D) =$$

$$SeqEnt(D)/N = -[\log_2 \Pr(D)]/N = \left(\log_2 \frac{N^N}{N!} - \sum_{k=1}^{K} \log_2 \frac{N_k^{N_k}}{N_k!}\right)/N;$$

wherein D denotes the data sequence being analyzed, SeqEnt denotes a sequence entropy, ASE denotes an average sequence entropy, N denotes a length of the data sequence being analyzed, and K denotes a size of an alphabet of the data sequence being analyzed.

In an embodiment of the invention, entropy information is stored, the entropy information indicating the entropy increases of at least a portion of the iterations. In another embodiment of the invention, the apparatus of the second aspect further comprises a first storage configured to store entropy information indicating the entropy increases of at least a portion of the iterations. In yet another embodiment of the invention, the apparatus of the fourth aspect further comprises a first storing means for storing entropy information indicating the entropy increases of at least a portion of the iterations.

In an embodiment of the invention, modeling information is stored, the modeling information indicating hierarchically each replaced at least two data elements and the corresponding replacement data element. In another embodiment of the invention, the apparatus of the second aspect further comprises a second storage configured to store modeling information indicating hierarchically each replaced at least two data elements and the corresponding replacement data element. In yet another embodiment of the invention, the apparatus of the fourth aspect further comprises a second storing means for storing modeling information indicating hierarchically each replaced at least two data elements and the corresponding replacement data element.

In an embodiment of the invention, the original data sequence is re-synthesized from the final residual data sequence by utilizing the stored modeling information to substitute hierarchically each replacement data element with the corresponding at least two data elements. In another embodiment of the invention, the apparatus of the second aspect further comprises a re-synthesizer configured to re-synthesize the original data sequence from the final residual data sequence by utilizing the stored modeling information to substitute hierarchically each replacement data element with the corresponding at least two data elements. In yet another embodiment of the invention, the apparatus of the fourth aspect further comprises a re-synthesizing means for re-synthesizing the original data sequence from the final residual data sequence by utilizing the stored modeling information to substitute hierarchically each replacement data element with the corresponding at least two data elements.

In an embodiment of the invention, at least one of the stored modeling information and the stored entropy information is utilized in searching patterns in a subsequent data sequence comprising a subsequent set of data elements in order to facilitate the searching. In another embodiment of the invention, the apparatus of the second aspect further comprises a modeler configured to utilize at least one of the stored modeling information and the stored entropy information in searching patterns in a subsequent data sequence comprising a subsequent set of data elements in order to facilitate the searching. In yet another embodiment of the invention, the apparatus of the fourth aspect further comprises a modeling means for utilizing at least one of the stored modeling information and the stored entropy information in searching patterns in a subsequent data sequence comprising a subsequent set of data elements in order to facilitate the searching.

In an embodiment of the invention, the iteration threshold comprises at least one of: the number of performed iterations; the number of data elements left in the residual data sequence being analyzed; and a threshold value of the metric of irregularity.

It is to be understood that the aspects and embodiments of the invention described above may be used in any combination with each other. Several of the aspects and embodiments may be combined together to form a further embodiment of the invention.

The invention allows finding regularities or patterns in data sequences more effectively than prior art approaches. The invention performs a global statistical or information theoretic analysis of the whole the sequence to be modeled (or a sufficiently large part of it) and searches for the best data element pair candidate to perform such an agglomeration (or many identical agglomerations) in the sequence that leads to e.g. the largest increase of the entropy (chaos) of the sequence. Thus, the agglomeration performed by the invention allows removing the structural component (or sub-structure) that strongest reduces the entropy. The agglomerated substructure is replaced by a new symbol. The invention further allows storing information indicating the agglomerated pair of data elements for possible later use. Also, the invention allows storing the corresponding change in the average sequence entropy.

Furthermore, the invention doesn't need any prior information about the sequences it models. All statistical information related to the sequences can be extracted from them instantaneously when the sequence is given. Thus the invention can be used in blind, unsupervised pattern discovery or data mining.

The pattern search according to the invention is applicable to various fields, such as data compression, data coding, pattern recognition, and data mining.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION OF THE PREFERRED EMBODIMENTS

Reference will now be made in detail to the embodiments of the invention, examples of which are illustrated in the accompanying drawings.

Figure 1A:
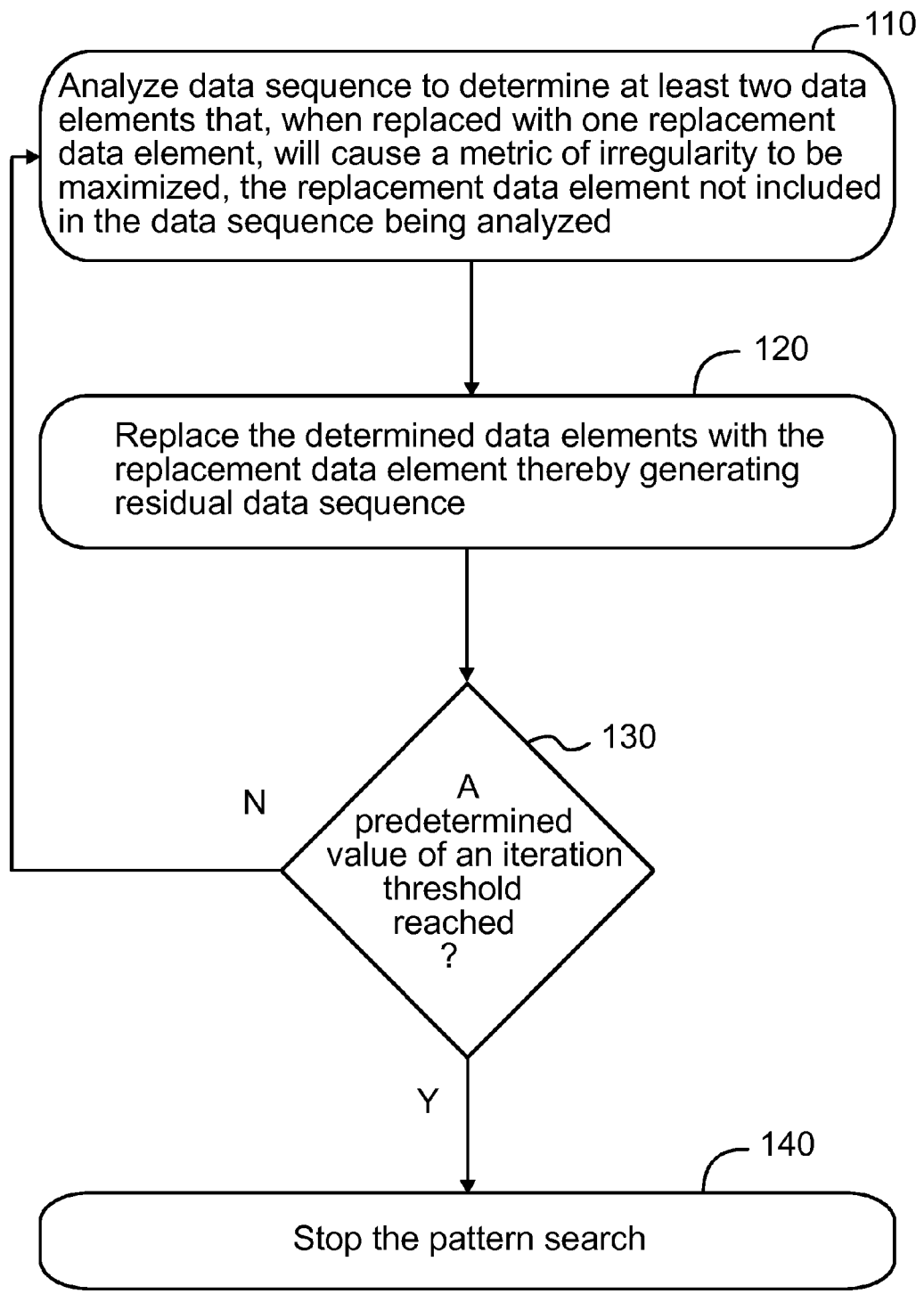
FIG. 1a is a flow diagram illustrating a method according to an embodiment of the invention.

FIG. 1a is a flow diagram illustrating a method according to an embodiment of the invention. At step 110, a data sequence comprising a set of data elements is analyzed to determine at least two data elements of the set of data elements that, when replaced with one replacement data element, will cause a predetermined metric of irregularity of the data sequence being analyzed to be maximized. The replacement data element is a data element that is not included in the set of data elements of the data sequence being analyzed.

The data sequence being analyzed is comprised in one or more computer readable files. That is, the data sequence being analyzed may be a binary sequence which may comprise a set of data elements encoded from given raw data. The given raw data may consist of a given finite alphabet, such as ASCII characters. Alternatively/additionally, the given raw data may include e.g. genome sequence data (e.g. four letters), and/or byte data, or and/or given prefix code. However, the given raw data is not limited to these examples. Furthermore, the data sequence being analyzed may be stored in a storage, such as a data buffer(s) e.g. in RAM or ROM memory, and, when needed, the data sequence being analyzed may be read from this storage fully at once or a part at a time.

At step 120, the determined at least two data elements are replaced with the replacement data element thereby generating a residual data sequence.

At step 130, it is determined whether a predetermined value of an iteration threshold is reached. If yes, the pattern search is stopped, step 140. If not, the process returns to step 110, and another iteration of analyzing and replacing is performed. With each iteration, the step 110 of analyzing and the step 120 of replacing are applied to the residual data sequence generated in the preceding iteration. The iteration threshold may comprise at least one of: the number of performed iterations; the number of data elements left in the residual data sequence being analyzed; and a threshold value of the metric of irregularity.

In other words, the general principle of the present invention can be illuminated by Equation 1:

$$D'=G(D|M(D)) \quad (\text{Eq. 1})$$

where:
D=data sequence to be modeled, or input
M=E(D), where
   M=derived model (or a set of replacement rules) for the sequence
   E=statistical engine (or analyzer)
   G=generator, or sequence processing method
   D'=residual sequence, or processed sequence, or output Equation 1 can be read as follows: input D is first analyzed with the statistical engine E and a model M of it is derived. Data sequence D is then processed by generator G in order to compress the sequence by removing the found patterns based on their model M. The process generates a new output, residual sequence D'.

Even more generally, the sequence D can be processed in a hierarchical bottom-up manner:

$$D_{i+1}=G(D_i|M(D_i)) i=0,1,2,\ldots; \quad (\text{Eq. 2})$$

where:
$D_0=D$
$G=\{g_1, g_2, g_3, \ldots, g_i, \ldots\}$

In the hierarchical case, the process described above is decomposed to elementary operations or iterations. At every time instant i, one iteration is performed and a new residual sequence is created. The residual is then re-circulated as a new input symbol sequence. Each recursion creates a new model M of order as well as a new elementary generator $g_i$. Each elementary generator can be interpreted as an elementary model, thus in these cases G==M, so that each $g_i==m_i$, where== denotes: practically the same, or can be strongly associated with.

If the process stops at iteration I, then an Ith order model is generated (G has I elementary generators).

The recursive structure of the process of the present invention can be interpreted as a statistically directed bottom-up process, where each step contains at least one of the following agglomerative operations or some combination of them:

$$ab \to C, aB \to C, Ab \to C, \text{ or } AB \to C; \quad (\text{Eq. 3})$$

where symbols a and b belong to those symbols present in the sequence D, and where C is a new symbol not previously observed in D, and where A and B are new symbols created earlier but also not observed in the original input sequence. Adopting terminology from formal languages, symbols a and b denote terminals because they are realizations in the sequence, whereas symbol A, B, and C denotes non-terminals.

For example, if sequence D consists of symbols with indices 1-128, the replacing symbol C of the first iteration may be a symbol with index 129, the replacing symbol of the second iteration may be a symbol with index 130, etc.

The statistical engine E analyses the whole sequence in order to find out the most efficient pair ab (or some other alternative) whose agglomeration to a new element C causes the largest, preferred change in a cost function (or a criterion function or a metric of irregularity) selected to control the modeling process. Also, a ranking function may be used to order pairs and to find out the highest ranked pair. The symbols a and b (as well as the other combinations) may be located next to each other (adjacent symbols) or they may have any distance d (where $N \geq d \geq 1$, N being the length of the sequence).

As a result, every agglomerative modification in D:
i) will change the statistical properties of D (e.g., some elements may disappear);
ii) is based on the analysis of the whole sequence D;
iii) will compress D by making it shorter; and
iv) brings a new code or symbol C into the sequence D.

The statistical engine E looks at the whole sequence, whereas the operations made based on the global analysis are local.

Thus the model M constructed iteratively from D by the statistical engine E is a set of agglomeration rules of the type of Equation 3, and the generator G consists of these primitive operations where terminal symbols (or some other combination of terminal and non-terminal symbols) are transformed to new non-terminals. Therefore we may say that G==M.

The iteration process may continue e.g. as long as:
1. The sequence has more than one element;
2. The criterion function of E has reached a desired threshold value;
3. The predefined number of iterations has been reached; or
4. Some other reason/condition to stop is reached.

When the recursion is halted, the output sequence D' can be notated as $D_I$ where index I denotes the number or iterations made.

Also, parallel grammars may be utilized in addition to/instead of a main grammar. A parallel grammar is formed e.g. as follows: at first, only every second symbol is extracted from the data sequence. Then, the remaining every second symbol is appended with the sequence that was first extracted, and a new grammar is formed for this subsampled sequence. Then, every third symbol is extracted, and they are appended, and a new grammar is formed for them. In other words, the parallel grammars may be generated with different lag values for the subsampled sequences, in parallel with the original grammar. In general, a new grammar is generated by extracting the elements from the original data sequence based on an index sequence I. Typically, the index sequence I may be e.g. as follows:

{1, 3, 5, 7, . . . 2, 4, 6, 8, . . . }, {1, 4, 7, . . . 2, 5, 8, . . . 3, 6, 9, . . . } etc.

However, it is to be understood that such an index sequence I is not limited to the above example.

A pattern indicates structure and it indicates regularity, i.e. something opposite to chaos and randomness. A well-known fact in the art is that a maximally chaotic (MaxEnt) sequence cannot include patterns or regularities of any kind. Thus an object of the method of the invention is to measure the distance of the sequence being analyzed from the MaxEntcase, and to perform agglomeration that brings the new sequence as close as possible to the maximally chaotic case. Thus the strongest structures are detected and removed in order to make the sequence more chaotic.

Therefore, the metric of irregularity used in the invention may comprise e.g. a degree of interdependency between the data elements of the set of data elements of the data sequence being analyzed such that the at least two data elements to be replaced are the data elements having the largest degree of interdependency between them.

A first interdependency based approach is to apply the classical theory of statistically independent variables (events). If any two elements in the sequence are independent, they cannot be part of any meaningful structure or pattern. In order to form something larger and systematic, the elements should show some kind of interdependency. Thus, according to the first approach, the first stage in the analysis of step 110 is to study all combinations found in the sequence and to find out by using a proper metric (or cost function) the best candidate for a substructure of a pattern.

$$P(AB) = P(A)P(B); \quad \text{(Eq. 4)}$$

Equation 4 gives a rule for independent events A and B. When $P(AB) > P(A)P(B)$ the events are said to have some interdependency. Thus, the relation $P(AB)/P(A)P(B)$ may measure the "degree of interdependency" of the events A and B. $P(A)$ denotes a probability of the data element A in the data sequence being analyzed, $P(B)$ denotes a probability of the data element B in the data sequence being analyzed, and $P(AB)$ denotes a probability of the data element pair AB in the data sequence being analyzed.

How then to obtain estimates for the probabilities? It is assumed that the method of the invention collects all its information from the outside world (i.e. from the sequence given) and there may be no prior information concerning the probabilities. Equation 5 shows an example of how to estimate the probabilities from a finite sequence.

$$P(AB) \approx \frac{N(AB)}{N_P} \quad P(A) \approx \frac{N(A)}{N} \quad P(B) \approx \frac{N(B)}{N}; \quad \text{(Eq. 5)}$$

where $N(A)$ and $N(B)$ denote the total number of elements A and B found in the sequence, $N(AB)$ denotes the number of occurrences of the pair AB in the sequence, and $N_P$ denotes the total number of pairs found in the sequence (typically N−1), and N denotes the length of the sequence.

When the sequence has only one element A, then its probability is very low and the ratio $P(AB)/P(A)P(B)$ gets a high value indicating a "strong substructure". However, we are working with a sequence and therefore a single case must not take the lead. Instead, we have to look at the average value of every substructure. Therefore, the ratio is multiplied with the probability of the pair (normalized by the average number of pairs in question). The final criterion to rank the different pairs is given by Equation 6:

$$F_{Pr1}(AB) = \frac{N(AB)N(AB)NN}{N_P N_P N(A)N(B)} = \left(\frac{N}{N_P}\right)^2 \frac{N(AB)^2}{N(A)N(B)} = \alpha^2 \frac{N(AB)^2}{N(A)N(B)}; \quad \text{(Eq. 6)}$$

where the constant alpha is $L/(L-1)$ in the case of lag (or sample distance between A and B) being 1 (i.e. A and B being next to each other in the data sequence). However, because $F_{Pr1}$ is used for the ranking of pairs (comparisons), alpha can be neglected.

A second interdependency based approach is to use a chi-squared-based ranking. When an expectation value in a chi-squared equation is replaced by the value of a fully random case, the equation gives indications for the statistical significance of the deviation from the random case, i.e., an indication of regularity.

$$F_{Pr2}(AB) = \beta \frac{(P(AB) - P(A)P(B))^2}{P(A)P(B)} \quad \text{(Eq. 7)}$$

$$\approx \beta \frac{N^2 \left(\frac{N(AB)}{N_P} - \frac{N(A)N(B)}{N^2}\right)^2}{N(A)N(B)}$$

$$= \beta \frac{\left(\frac{NN(AB)}{N_P} - \frac{N(A)N(B)}{N}\right)^2}{N(A)N(B)};$$

$$\beta = \begin{cases} +1 & \text{when } P(AB) > P(A)P(B) \\ -1 & \text{when } P(AB) < P(A)P(B) \end{cases};$$

The last row of the Equation 7 shows that when the sequence is long (length N), the first term dominates over the second. Finally, when N grows to infinity, Equation 7 will be equal to Equation 6.

A third interdependency based approach is to use divergence based Equation 8:

$$KLD(AB) = [1 - P(A) - P(B)]\log_2 \frac{N - N(AB)}{N} + \sum_{x=A,B} P(x)\log_2 P(x) \frac{N - N(AB)}{N(x) - N(AB)}; \quad \text{(Eq. 8)}$$

wherein KLD(AB) denotes Kullback-Leibler divergence based measure for degree of interdependency of the data element pair AB, P(A) denotes a probability of a data element A in the data sequence being analyzed, P(B) denotes a probability of a data element B in the data sequence being analyzed, N(AB) denotes the total number of data element pairs AB, and N denotes a length of the data sequence being analyzed (total number of elements). Here, a maximum value of divergence is searched for each data element pair AB, and the pair producing this is transformed: AB->C. If N(x)−N(AB)=0, it can be replaced, e.g. by 1.

Alternatively, the metric of irregularity used in the invention may comprise e.g. an entropy of the data sequence being analyzed such that the at least two data elements to be replaced are the data elements the replacement of which will cause the largest entropy increase in the data sequence being analyzed.

According to information theory, a sequence free of any kind of regularity is a Maximum Entropy (MaxEnt) sequence. Thus, a first entropy based approach is to use Shannon Information Entropy (InfEnt) for sequence entropy. The InfEnt measure for a sequence D may be defined as Equation 9:

$$InfEnt(D) = -\sum_{k=1}^{K} p_k \log_2 p_k;$$ (Eq. 9)

where $p_k$ denotes probability of the symbol k in the set of K alphabets. Based on Equation 10, the probabilities can be estimated by relative frequencies. One possible method to apply InfEnt is to try different possible agglomerations and to monitor their effect on the InfEnt-measure. The pair AB providing the largest entropy increase (the largest entropy gradient value) is selected first, and after the agglomerative transform AB->C, the process is repeated as long as needed (e.g., as long as the entropy is increasing). The number of iterations defines the order of the obtained model.

A second entropy based approach is to use a new entropy measure called Sequence Entropy (SeqEnt) for sequence entropy. The Sequence Entropy (SeqEnt) differs from InfEnt considerably since it represents true physical entropy. SeqEnt is based on the theory of multinomial distribution.

When the size of the alphabet is K, and the relative frequencies of the different symbols in the sequence are $N_k/N$ (k=1, 2, ..., K), then the multinomial probability of the sequence D may be defined as Equation 10:

$$\Pr(D) = \frac{N!}{N_1!N_2!N_3!\ldots N_K!}\left(\frac{N_1}{N}\right)^{N_1}\left(\frac{N_2}{N}\right)^{N_2}\ldots\left(\frac{N_K}{N}\right)^{N_K};$$ (Eq. 10)

This can be transformed to the corresponding SeqEnt by manipulating the terms and by taking a logvalue:

$$SeqEnt(D) = -\log_2 \Pr(D) = \log_2 \frac{N^N}{N!} - \sum_{k=1}^{K} \log_2 \frac{N_k^{N_k}}{N_k!};$$ (Eq. 11)

The length of the sequence D is N. This measure shown in Equation 11 can be utilized in a manner similar to InfEnt to find out the symbol pair AB the agglomeration of which will lead to the largest entropy increase.

Furthermore, the Sequence Entropy of Equation 11 may be averaged over the length N of the data sequence being analyzed in order to obtain an average sequence entropy, as shown in Equation 12:

$$ASE(D)=SeqEnt(D)/N;$$ (Eq. 12)

wherein ASE denotes the Average Sequence Entropy, and SeqEnt is defined by Equation 11.

Figure 1B:
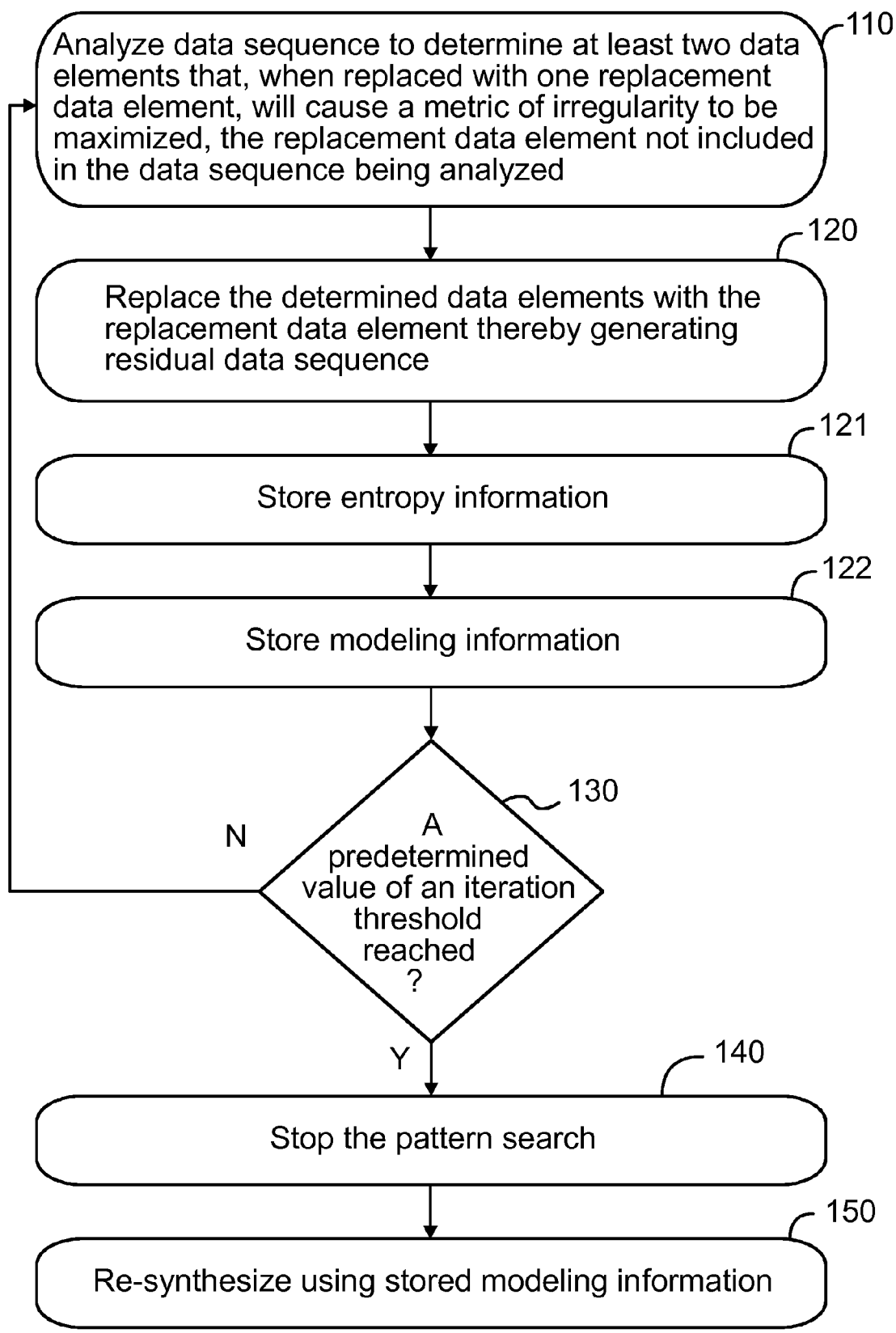
FIG. 1b is a flow diagram illustrating a method according to another embodiment of the invention.

FIG. 1b is a flow diagram illustrating a method according to another embodiment of the invention. Steps 110, 120, 130 and 140 are similar to the case of FIG. 1a, and therefore they will not be described here again.

However, FIG. 1b also includes step 121 in which entropy information is stored. The entropy information indicates the entropy increases of at least a portion of the iterations. At step 122, modeling information is stored. The modeling information indicates hierarchically each replaced at least two data elements and the corresponding replacement data element. At step 150, the original data sequence is re-synthesized from the final residual data sequence by utilizing the stored modeling information to substitute hierarchically each replacement data element with the corresponding at least two data elements.

In other words, using the model M (or the set of replacement rules or the modeling information) and the compressed residual sequence D' as the initial sequence, the original sequence D can be re-synthesized in a top-down process by applying the agglomeration rules of Equation 3 in a reversed order $G'=\{g_1, g_{I-1}, g_{I-2}, \ldots, g_1\}$ and as generative rules, as shown by Equation 13. Parameter I denotes the total number of agglomeration/generation rules.

$$C \rightarrow ab, C \rightarrow AB, C \rightarrow aB, \text{ or } C \rightarrow Ab;$$ (Eq. 13)

where four different possibilities may occur depending on the type of generated symbols (terminals or non-terminals). When all the rules G' are used, the residual is expanded back into the form of the original input sequence D.

A recursive formula for the re-synthesis is thus Equation 14:

$$D_{I-i-1}=G'_{i+1}(D_{I-i})i=0,1,2,\ldots,I-1;$$ (Eq. 14)

with the starting sequence being $D_I=D'$ (residual sequence of the Ith order model) and the generated sequence being $D_0=D$ (the original input sequence of the analysis, Eq. 2).

Figure 1C:
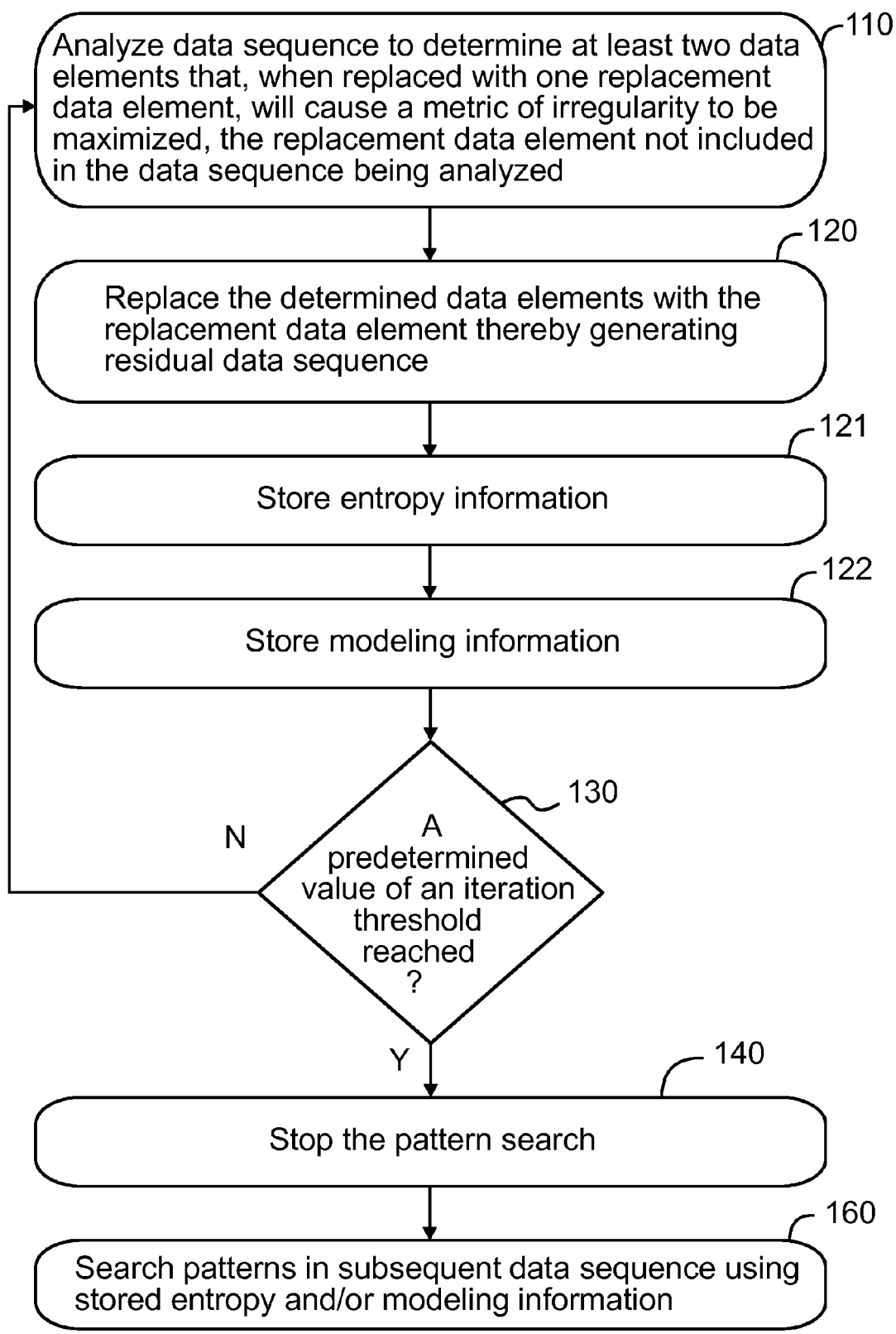
FIG. 1c is a flow diagram illustrating a method according to yet another embodiment of the invention.

FIG. 1c is a flow diagram illustrating a method according to yet another embodiment of the invention. Steps 110, 120, 121, 122, 130 and 140 are similar to the case of FIG. 1b, and therefore they will not be described here again. However, FIG. 1c also includes step 160 in which at least one of the stored modeling information and the stored entropy information is utilized in searching patterns in a subsequent data sequence comprising a subsequent set of data elements in order to facilitate the searching.

The method of the invention can be applied to e.g. blind pattern discovery, extraction, and sequence segmentation. When the iterative (recursive) agglomeration process ends, the obtained residual sequence contains pointers (indices) to the hierarchical memory of the elementary patterns. If the input sequence consists of integers [1, K] (where K is the size of the alphabet), then the first non-terminal may be indexed by K+1 and the last K+I (where I is the order of the model). Thus the integer K+I in the residual sequence indicates the latest agglomeration.

Now all the patterns found in the input sequence may be re-synthesized separately by taking each non-terminal index (possible in order from left to right) in the residual sequence and then expanding it back by fetching the corresponding generator from the memory. The expanding process continues until all non-terminals have vanished.

When all non-terminals in the residual sequence have been transformed back to non-terminal sequences, all the patterns found in the input sequence have been re-created. Next, the information processing may go on in many different ways depending on the application. For example, if the object is blind segmentation of the sequence, then natural positions for segment boundaries are around the terminal elements still left in the residual sequence, whereas the found patterns form natural candidates for the information contents of the segments.

When the method is working in a blind mode without any additional information (i.e. blind pattern discovery, unsupervised learning), the discovered patterns may be collected to a store, compared with each other, and clustered by using an appropriate distance measure. The obtained pattern clusters will form a new level in the information hierarchy. In the recognition phase, the obtained pattern clusters may serve as prototypes or categories.

The recursive agglomeration process creates not only the rules but also gives a numeric value for the entropy increase. These differential entropy values can be stored and associated with the rules for later usage. For example, the found, context-sensitive, differential information/entropy values may be integrated over the discovered patterns in order to find their "information value" and ranking. Also, these integrated values may be used during the recognition phase in various ways.

Figure 2:
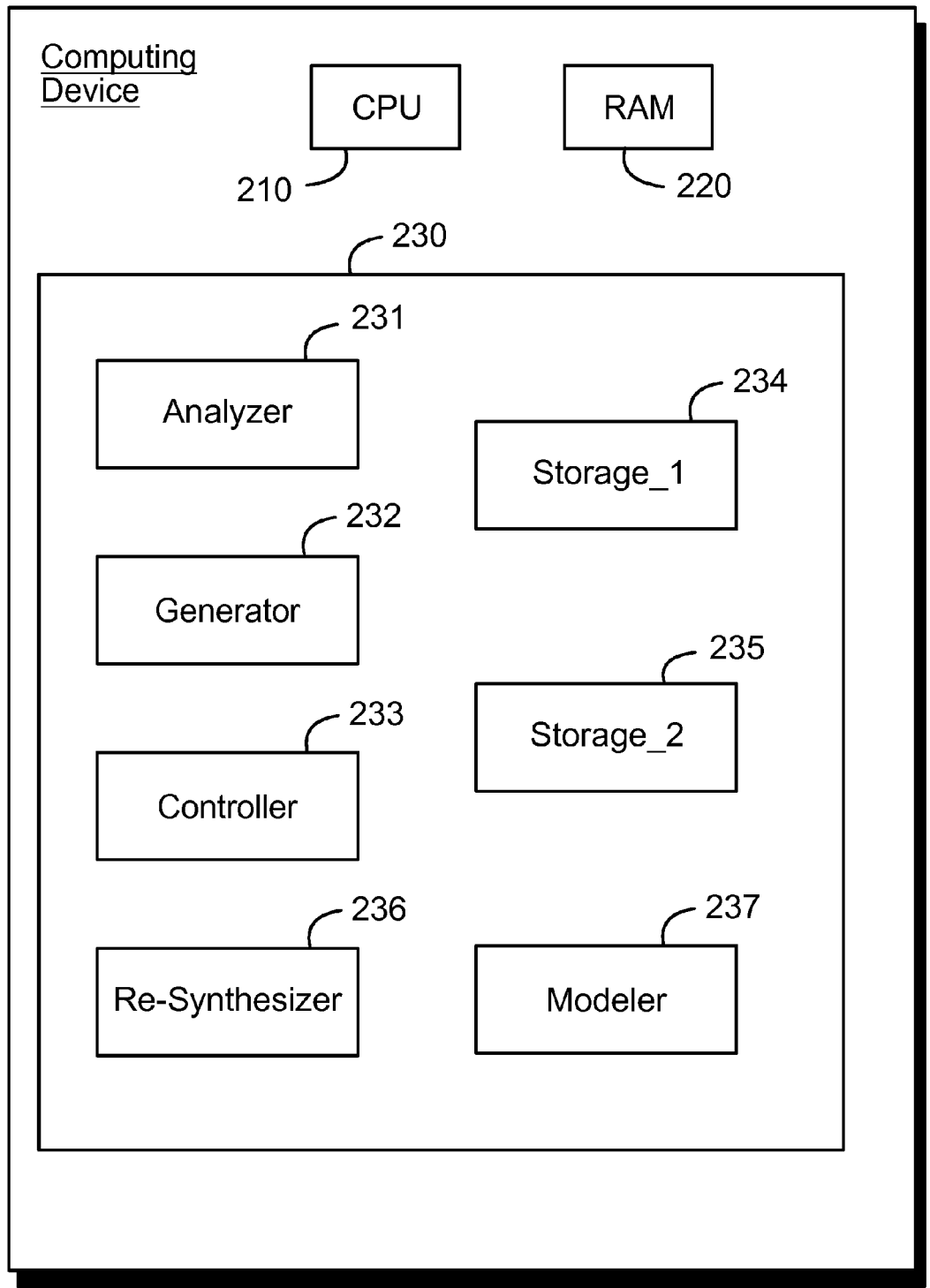
FIG. 2 is a block diagram illustrating an apparatus according to an embodiment of the invention.

FIG. 2 is a block diagram illustrating an apparatus 230 according to an embodiment of the invention. The apparatus 230 may be implemented e.g. in a computing device 200, as illustrated in FIG. 2. The computing device 200 may be e.g. a any suitable server, workstation, personal computer, laptop computer, personal digital assistant, handheld device, or a wireless device such as a smart phone. Furthermore, the computing device 200 may comprise a central processing unit 210 and memory 220, as will be appreciated by those skilled in the hardware and/or software art(s).

The apparatus 230 comprises an analyzer 231 that is configured to analyze a data sequence comprising a set of data elements to determine at least two data elements of the set of data elements that, when replaced with one replacement data element, will cause a predetermined metric of irregularity of the data sequence being analyzed to be maximized, the replacement data element not included in the set of data elements of the data sequence being analyzed. Also, as discussed above, the data sequence being analyzed is comprised in one or more computer readable files. The analyzer 231 may be configured to utilize at least one of the various approaches described above in connection with FIGS. 1a-1c to determine the at least two data elements.

The apparatus 230 further comprises a generator 232 that is configured to replace the determined at least two data elements with the replacement data element thereby generating a residual data sequence. The apparatus 230 further comprises a controller 233 that is configured to direct the analyzer and the generator to iterate the analyzing and replacing until reaching a predetermined value of an iteration threshold, wherein with each iteration the analyzing and replacing are applied to the residual data sequence generated in the preceding iteration.

Optionally, the apparatus 230 may further comprise a first storage 234 that is configured to store entropy information indicating the entropy increases of at least a portion of the iterations. Optionally, the apparatus 230 may further comprise a second storage 235 that is configured to store modeling information indicating hierarchically each replaced at least two data elements and the corresponding replacement data element.

Optionally, the apparatus 230 may further comprise a re-synthesizer 236 that is configured to re-synthesize the original data sequence from the final residual data sequence by utilizing the stored modeling information to substitute hierarchically each replacement data element with the corresponding at least two data elements. Optionally, the apparatus 230 may further comprise a modeler 237 that is configured to utilize at least one of the stored modeling information and the stored entropy information in searching patterns in a subsequent data sequence comprising a subsequent set of data elements in order to facilitate the searching.

Each of the various elements of the apparatus 230 described above may be implemented in software, in hardware, or as a combination of software and hardware.

The exemplary embodiments can include, for example, any suitable servers, workstations, PCs, laptop computers, personal digital assistants (PDAs), Internet appliances, handheld devices, cellular telephones, smart phones, wireless devices, other devices, and the like, capable of performing the processes of the exemplary embodiments. The devices and subsystems of the exemplary embodiments can communicate with each other using any suitable protocol and can be implemented using one or more programmed computer systems or devices.

One or more interface mechanisms can be used with the exemplary embodiments, including, for example, Internet access, telecommunications in any suitable form (e.g., voice, modem, and the like), wireless communications media, and the like. For example, employed communications networks or links can include one or more wireless communications networks, cellular communications networks, 3 G communications networks, Public Switched Telephone Network (PSTNs), Packet Data Networks (PDNs), the Internet, intranets, a combination thereof, and the like.

It is to be understood that the exemplary embodiments are for exemplary purposes, as many variations of the specific hardware used to implement the exemplary embodiments are possible, as will be appreciated by those skilled in the hardware and/or software art(s). For example, the functionality of one or more of the components of the exemplary embodiments can be implemented via one or more hardware and/or software devices.

The exemplary embodiments can store information relating to various processes described herein. This information can be stored in one or more memories, such as a hard disk, optical disk, magneto-optical disk, RAM, and the like. One or more databases can store the information used to implement the exemplary embodiments of the present inventions. The databases can be organized using data structures (e.g., records, tables, arrays, fields, graphs, trees, lists, and the like) included in one or more memories or storage devices listed herein. The processes described with respect to the exemplary embodiments can include appropriate data structures for storing data collected and/or generated by the processes of the devices and subsystems of the exemplary embodiments in one or more databases.

All or a portion of the exemplary embodiments can be conveniently implemented using one or more general purpose processors, microprocessors, digital signal processors, micro-controllers, and the like, programmed according to the teachings of the exemplary embodiments of the present inventions, as will be appreciated by those skilled in the computer and/or software art(s). Appropriate software can be readily prepared by programmers of ordinary skill based on the teachings of the exemplary embodiments, as will be appreciated by those skilled in the software art. In addition, the exemplary embodiments can be implemented by the preparation of application-specific integrated circuits or by interconnecting an appropriate network of conventional component circuits, as will be appreciated by those skilled in the electrical art(s). Thus, the exemplary embodiments are not limited to any specific combination of hardware and/or software.

Stored on any one or on a combination of computer readable media, the exemplary embodiments of the present inventions can include software for controlling the components of the exemplary embodiments, for driving the components of the exemplary embodiments, for enabling the components of the exemplary embodiments to interact with a human user, and the like. Such software can include, but is not limited to, device drivers, firmware, operating systems, development tools, applications software, and the like. Such computer readable media further can include the computer program product of an embodiment of the present inventions for performing all or a portion (if processing is distributed) of the processing performed in implementing the inventions. Computer code devices of the exemplary embodiments of the present inventions can include any suitable interpretable or executable code mechanism, including but not limited to scripts, interpretable programs, dynamic link libraries (DLLs), Java classes and applets, complete executable programs, Common Object Request Broker Architecture (CORBA) objects, and the like. Moreover, parts of the processing of the exemplary embodiments of the present inventions can be distributed for better performance, reliability, cost, and the like.

As stated above, the components of the exemplary embodiments can include computer readable medium or memories for holding instructions programmed according to the teachings of the present inventions and for holding data structures, tables, records, and/or other data described herein. Computer readable medium can include any suitable medium that participates in providing instructions to a processor for execution. Such a medium can take many forms, including but not limited to, non-volatile media, volatile media, trans-mission media, and the like. Non-volatile media can include, for example, optical or magnetic disks, magneto-optical disks, and the like. Volatile media can include dynamic memories, and the like. Transmission media can include coaxial cables, copper wire, fiber optics, and the like. Transmission media also can take the form of acoustic, optical, electromagnetic waves, and the like, such as those generated during radio frequency (RF) communications, infrared (IR) data communications, and the like. Common forms of computer readable media can include, for example, a floppy disk, a flexible disk, hard disk, magnetic tape, any other suitable magnetic medium, a CD-ROM, CD±R, CD±RW, DVD, DVD-RAM, DVD±RW, DVD±R, HD DVD, HD DVD-R, HD DVDRW, HD DVD-RAM, Blu-ray Disc, any other suitable optical medium, punch cards, paper tape, optical mark sheets, any other suitable physical medium with patterns of holes or other optically recognizable indicia, a RAM, a PROM, an EPROM, a FLASH-EPROM, any other suitable memory chip or cartridge, a carrier wave or any other suitable medium from which a computer can read.

While the present inventions have been described in connection with a number of exemplary embodiments, and implementations, the present inventions are not so limited, but rather cover various modifications, and equivalent arrangements, which fall within the purview of prospective claims.

What is claimed is:

1. A method of searching patterns in a data sequence, comprising:
    analyzing a data sequence comprising a set of data elements to determine at least two data elements of said set of data elements that, when replaced with one replacement data element, will cause a predetermined metric of irregularity of the data sequence being analyzed to be maximized, said replacement data element not included in the set of data elements of the data sequence being analyzed, wherein said data sequence being analyzed is comprised in one or more computer readable files;
    replacing the determined at least two data elements with said replacement data element thereby generating a residual data sequence; and
    iterating said steps of analyzing and replacing until reaching a predetermined value of an iteration threshold, wherein with each iteration said steps of analyzing and replacing are applied to the residual data sequence generated in the preceding iteration, said metric of irregularity comprising an entropy of the data sequence being analyzed such that said at least two data elements to be replaced are the data elements the replacement of which will cause the largest entropy increase in the data sequence being analyzed and said entropy of said data sequence being analyzed comprising:

$$ASE(D) = SeqEnt(D)/N = -[\log_2 \Pr(D)]/N = \left( \log_2 \frac{N^N}{N!} - \sum_{k=1}^{K} \log_2 \frac{N_k^{N_k}}{N_k!} \right) / N;$$

wherein D denotes the data sequence being analyzed, SeqEnt denotes a sequence entropy, ASE denotes an average sequence entropy, N denotes a length of the data sequence being analyzed, and K denotes a size of an alphabet of the data sequence being analyzed.

2. The method according to claim 1, further comprising storing entropy information indicating the entropy increases of at least a portion of the iterations.

3. The method according to claim 1, further comprises storing modeling information indicating hierarchically each replaced at least two data elements and the corresponding replacement data element.

4. The method according to claim 3, further comprises re-synthesizing the original data sequence from the final residual data sequence by utilizing the stored modeling information to substitute hierarchically each replacement data element with the corresponding at least two data elements.

5. The method according to claim 3, further comprises utilizing at least one of the stored modeling information and the stored entropy information in searching patterns in a subsequent data sequence comprising a subsequent set of data elements to facilitate said searching.

6. The method according to claim 1, wherein said iteration threshold comprises at least one of:
    the number of performed iterations;
    the number of data elements left in the residual data sequence being analyzed; and
    a threshold value of said metric of irregularity.

7. An apparatus for searching patterns in a data sequence, the apparatus comprising:
    an analyzer comprising hardware configured to analyze a data sequence comprising a set of data elements to determine at least two data elements of said set of data elements that, when replaced with one replacement data element, will cause a predetermined metric of irregularity of the data sequence being analyzed to be maximized, said replacement data element not included in the set of data elements of the data sequence being analyzed, wherein said data sequence being analyzed is comprised in one or more computer readable files;
    a generator configured to replace the determined at least two data elements with said replacement data element thereby generating a residual data sequence; and
    a controller configured to direct said analyzer and said generator to iterate said analyzing and replacing until reaching a predetermined value of an iteration threshold, wherein with each iteration said analyzing and replacing are applied to the residual data sequence generated in the preceding iteration, said metric of irregularity comprising entropy of the data sequence being analyzed such that said at least two data elements to be replaced are the data elements the replacement of which will cause the largest entropy increase in the data sequence being analyzed and wherein said analyzer is configured to determine said entropy of said data sequence being analyzed as comprising:

$$ASE(D) = SeqEnt(D)/N = -[\log_2 \Pr(D)]/N = \left(\log_2 \frac{N^N}{N!} - \sum_{k=1}^{K} \log_2 \frac{N_k^{N_k}}{N_k!}\right)/N;$$

wherein D denotes the data sequence being analyzed, SeqEnt denotes a sequence entropy, ASE denotes an average sequence entropy, N denotes a length of the data sequence being analyzed, and K denotes a size of an alphabet of the data sequence being analyzed.

8. The apparatus according to claim 7, further comprising a first storage configured to store entropy information indicating the entropy increases of at least a portion of the iterations.

9. The apparatus according to claim 7, further comprises a second storage configured to store modeling information indicating hierarchically each replaced at least two data elements and the corresponding replacement data element.

10. The apparatus according to claim 9, further comprising a re-synthesizer configured to re-synthesize the original data sequence from the final residual data sequence by utilizing the stored modeling information to substitute hierarchically each replacement data element with the corresponding at least two data elements.

11. The apparatus according to claim 9, further comprising a modeler configured to utilize at least one of the stored modeling information and the stored entropy information in searching patterns in a subsequent data sequence comprising a subsequent set of data elements to facilitate said searching.

12. The apparatus according to claim 7, wherein said iteration threshold comprises at least one of:
   the number of performed iterations;
   the number of data elements left in the residual data sequence being analyzed; and
   a threshold value of said metric of irregularity.

13. A computer program embodied on a non-transitory computer readable medium for searching patterns in a data sequence, characterized in that the computer program controls a data-processing device to perform the steps of:
   analyzing a data sequence comprising a set of data elements to determine at least two data elements of said set of data elements that, when replaced with one replacement data element, will cause a predetermined metric of irregularity of the data sequence being analyzed to be maximized, said replacement data element not included in the set of data elements of the data sequence being analyzed, wherein said data sequence being analyzed is comprised in one or more computer readable files;
   replacing the determined at least two data elements with said replacement data element thereby generating a residual data sequence; and
   iterating said steps of analyzing and replacing until reaching a predetermined value of an iteration threshold, wherein with each iteration said steps of analyzing and replacing are applied to the residual data sequence generated in the preceding iteration, said metric of irregularity comprising an entropy of the data sequence being analyzed such that said at least two data elements to be replaced are the data elements the replacement of which will cause the largest entropy increase in the data sequence being analyzed and said entropy of said data sequence being analyzed comprising:

$$ASE(D) = SeqEnt(D)/N = -[\log_2 \Pr(D)]/N = \left(\log_2 \frac{N^N}{N!} - \sum_{k=1}^{K} \log_2 \frac{N_k^{N_k}}{N_k!}\right)/N;$$

wherein D denotes the data sequence being analyzed, SeqEnt denotes a sequence entropy, ASE denotes an average sequence entropy, N denotes a length of the data sequence being analyzed, and K denotes a size of an alphabet of the data sequence being analyzed.

14. A computer program embodied on a computer readable medium for re-synthesizing a data sequence, characterized in that the computer program controls a data-processing device to perform the steps of:
   reading previously stored modeling information indicating hierarchically each replaced at least two data elements and the corresponding replacement data element in a pattern search performed with a computer program according to claim 13; and
   re-synthesizing the original data sequence from the final residual data sequence by utilizing the stored modeling information to substitute hierarchically each replacement data element with the corresponding at least two data elements.

15. A computer program embodied on a computer readable medium for searching patterns in a subsequent data sequence, characterized in that the computer program controls a data-processing device to perform the steps of:
   reading previously stored modeling information indicating hierarchically each replaced at least two data elements and the corresponding replacement data element in a pattern search performed with a computer program according to claim 13; and
   utilizing the stored modeling information in searching patterns in a subsequent data sequence comprising a subsequent set of data elements to facilitate said searching.

* * * * *